(12) United States Patent
Horikawa

(10) Patent No.: US 6,172,919 B1
(45) Date of Patent: Jan. 9, 2001

(54) SEMICONDUCTOR MEMORY DEVICE WITH INDEPENDENTLY CONTROLLED READING AND WRITING TIME PERIODS

(75) Inventor: Jun Horikawa, Shiga (JP)

(73) Assignee: Matsushita Electric Industrial Co., Ltd., Osaka (JP)

( * ) Notice: Under 35 U.S.C. 154(b), the term of this patent shall be extended for 0 days.

(21) Appl. No.: 09/273,845

(22) Filed: Mar. 22, 1999

(30) Foreign Application Priority Data

Apr. 27, 1998 (JP) .................................................. 10-117142

(51) Int. Cl.[7] ....................................................... G11C 7/00
(52) U.S. Cl. ...................... 365/190; 365/194; 365/189.01
(58) Field of Search ............................... 365/189.01, 190, 365/191, 194, 230.06

(56) References Cited

U.S. PATENT DOCUMENTS

| 5,500,820 | * | 3/1996 | Nakaoka | 365/189.01 |
| 5,621,693 | * | 4/1997 | Nakase | 365/227 |
| 5,659,512 | * | 8/1997 | Koyanagi et al. | 365/203 |
| 5,812,464 | | 9/1998 | Kim | 365/194 |
| 5,841,717 | | 11/1998 | Yamaguchi | 365/205 |
| 5,867,447 | * | 2/1999 | Koshikawa | 365/233 |

* cited by examiner

Primary Examiner—Son Mai
(74) Attorney, Agent, or Firm—Harness, Dickey & Pierce, P.L.C.

(57) ABSTRACT

The operating speed and stability of a semiconductor memory device of the type performing reading and writing at regular intervals are improved. A read/write pulse width controller varies the pulse width of a read/write pulse width control signal in such a manner that the width during reading is shorter than that during writing. A column decoder outputs a column-select signal having a pulse width equal to that of the read/write pulse width control signal. And a column-select gate connects an associated pair of bit lines to a pair of data lines while the column-select signal is high. During reading, a sufficiently long time can be allotted for equalizing potentials on the data lines. On the other hand, during writing, plenty of time can be allowed for connecting a pair of data lines to the pair of bit line. As a result, reading and writing can be performed stably enough at a sufficiently high speed.

2 Claims, 4 Drawing Sheets

SEMICONDUCTOR MEMORY DEVICE WITH INDEPENDENTLY CONTROLLED READING AND WRITING TIME PERIODS

BACKGROUND OF THE INVENTION

The present invention generally relates to semiconductor memory device technology, and more particularly relates to a semiconductor memory device performing reading and writing at regular intervals in synchronism with clock pulses externally supplied.

In recent years, semiconductor memory devices of various types, like synchronous DRAM's, operating at a high speed in synchronism with external clock pulses have been applied to numerous appliances.

In such a clocked semiconductor memory device, a timing signal is produced as a trigger for activating respective circuit components within the device responsive to an external clock pulse. As for a DRAM, a column-select-gate-activating signal is used as one of such timing signals. The column-select-gate-activating signal is used for controlling the ON/OFF states of a specific column-select gate provided between a pair of bit lines, associated with each of a great number of columns in an array of memory cells, and a pair of data lines. After a particular column-select gate has been specified in response to a given column address, the column-select gate is kept ON to connect a pair of bit lines, associated with the column-select gate, to the pair of data lines so long as the column-select-gate-activating signal is asserted.

During reading, data, which has been read out from a selected memory cell onto the associated pair of bit lines, is amplified by a sense amplifier and then transferred to the pair of data lines via the associated column-select gate that has been turned ON. The data, which has arrived at the pair of data lines, is further amplified by a read amplifier and then output to the outside of the device through a data output circuit.

On the other hand, during writing, data, which has been input from the outside of the device, is supplied to a write amplifier via a data input circuit. In response to the data supplied, the write amplifier drives the pair of data lines and then transfers the data to the associated pair of bit lines via the associated column-select gate that has been turned ON.

FIG. 4 is a timing diagram illustrating an exemplary operation of a conventional semiconductor memory device. In FIG. 4, CLK denotes an external clock signal; /CS, /RAS, /CAS and /WE respective control signals; IRW a column-select-gate-activating signal; and Y a column-select signal for controlling a column-select gate. In the example illustrated in FIG. 4, reading is performed first, and in response to the input of a write command in synchronism with the third leading edge of the external clock signal CLK, the mode of operation is switched from reading into writing. The write command is input after the control signals /CS, /CAS and /WE have been asserted as logically low and while the control signal /RAS is negated as logically high. The column-select signal Y is asserted as logically high while the column-select-gate-activating signal IRW is high. When the column-select signal Y is asserted, the associated column-select gate turns ON. As a result, the associated pair of bit lines are connected to the pair of data lines.

The conventional semiconductor memory device, however, causes the following problems if the device is operated at a higher speed with the frequency of the external clock signal increased.

In writing specified data into a selected memory cell, the write amplifier should drive not only the pair of data lines but also the associated pair of bit lines via the column-select gate to invert the data latched in the sense amplifier. Accordingly, while allowing the potentials on the pair of data lines to swing greatly, the column-select gate should be kept ON for a time long enough to connect the associated pairs of bit lines to the pair of data lines. That is to say, in performing writing, a time required for establishing a connection between the pairs of data lines and bit lines should be sufficiently long.

In contrast, during reading, since the potentials on the pair of data lines usually swing more slowly, these potentials should be equalized with each other to a large degree before the data is read out. Otherwise, it would take an adversely long time to completely erase the previous data remaining on the pair of data lines, thus delaying reading accordingly. In other words, during reading, a time required for equalizing the potentials on the pair of data lines with each other should also be long enough.

In the conventional semiconductor memory device, however, the column-select-gate-activating signal IRW is cyclically asserted/negated at the same regular intervals no matter whether the mode of operation is reading or writing. Accordingly, the interval, in which a column-select gate is ON, i.e., the time for connecting a pair of data lines to an associated pair of bit lines, is the same irrespective of the mode of operation.

Such a conventional semiconductor memory device cannot operate stably enough at a high speed if the frequency of an external clock signal is increased. In other words, if a pair of data lines are to be connected to an associated pair of bit lines within a sufficiently long time during writing, then it is difficult to afford an abundant time for equalizing the potentials on the pair of data lines during reading. Nevertheless, if a rather long time is allotted for equalizing the potentials on the pair of data lines during reading by shortening the time for connecting the pairs of data lines and bit lines, then it is hard to allow plenty of time for connecting these lines during writing.

SUMMARY OF THE INVENTION

A prime object of the present invention is providing a semiconductor memory device that can perform reading and writing stably enough at a sufficiently high speed.

The semiconductor memory device of the present invention includes: an array of memory cells arranged in columns and rows; plural pairs of bit lines, each said pair of bit lines being provided for associated one of the columns in the array; a pair of data lines, through which data to be written into, or read out from, the array are transferred; control means for selecting one of the plural pairs of bit lines and controlling electrical connection/disconnection between the selected pair of bit lines and the pair of data lines during reading and writing; equalizing means for equalizing potentials on the pair of data lines with each other while none of the pairs of bit lines are connected to the pair of data lines during reading; and a write amplifier for driving the pair of data lines in response to data supplied during writing. The control means independently controls a time required for connecting the selected pair of bit lines to the pair of data lines during reading or writing, even if reading and writing are performed at the same regular intervals.

According to the present invention, the time for connecting a selected pair of bit lines to a pair of data lines can be controlled independently during reading or writing, even if reading and writing are performed at the same regular intervals. Thus, if the time for connecting the pairs of bit lines and data lines to each other is shortened during reading, then the connect time may be longer during writing, or vice versa. Accordingly, since a sufficiently long time can be allotted for equalizing the potentials on the pair of data lines during reading, data can be read out at a high speed. In addition, since plenty of time can be allowed for connecting the pairs of bit lines and data lines during writing, data can be written more accurately. As a result, high-speed and highly stabilized reading and writing are realized.

In one embodiment of the present invention, the control means preferably allots a longer time for connecting the selected pair of bit lines to the pair of data lines during writing than during reading.

In such an embodiment, a longer time is allotted for connecting the selected pair of bit lines to the pair of data lines during writing than during reading. Accordingly, since plenty of time can be allowed for equalizing the potentials on the pair of data lines during reading, data can be read out at a high speed. In addition, since an abundant time is allowed for connecting the selected pair of bit lines to the pair of data lines during writing, data can be written more accurately. As a result, high-speed and highly stabilized reading and writing are realized.

In another embodiment, the semiconductor memory device of the present invention preferably performs reading and writing in synchronism with clock pulses externally supplied at regular intervals.

In still another embodiment, the control means preferably includes: a read/write pulse width controller for generating a pulse signal as a read/write pulse width control signal in synchronism with each said external clock pulse, the pulse signal having a pulse width variable with whether the mode of operation is reading or writing; a column decoder for selecting one of the columns in the array in response to an externally given column address, and asserting a column-select signal associated with the selected column while the read/write pulse width control signal is in a logical state; and a plurality of column-select gates, each said column-select gate being provided for associated one of the plural pairs of bit lines and connecting the associated pair of bit lines to the pair of data lines while the associated column-select signal is asserted.

In such an embodiment, the time required for each column-select gate to connect an associated pair of bit lines to the pair of data lines is determined depending on the pulse width of the read/write pulse width control signal. Since the pulse width is variable with the mode of operation, i.e., reading or writing, the time for connecting the associated pair of bit line to the pair of data lines during reading may be of a different length than that during writing. Accordingly, it is possible to implement a semiconductor memory device, which can perform reading and writing stably enough at a sufficiently high speed responsive to external clock pulses, using a simplified configuration.

In still another embodiment, the pulse width of the read/write pulse width control signal is preferably longer during writing than during reading.

In still another embodiment, the read/write pulse width controller preferably includes delay means, and produces a one-shot pulse, having a pulse width determined by a delay time caused by the delay means, as the read/write pulse width control signal during reading.

In such an embodiment, the time for connecting the associated pair of bit lines to the pair of data lines during reading may be defined at a desired value based on the delay time caused by the delay means independent of the time defined for writing.

DESCRIPTION OF THE PREFERRED EMBODIMENTS

Hereinafter, a preferred embodiment of the present invention will be described with reference to the accompanying drawings.

Figure 1:
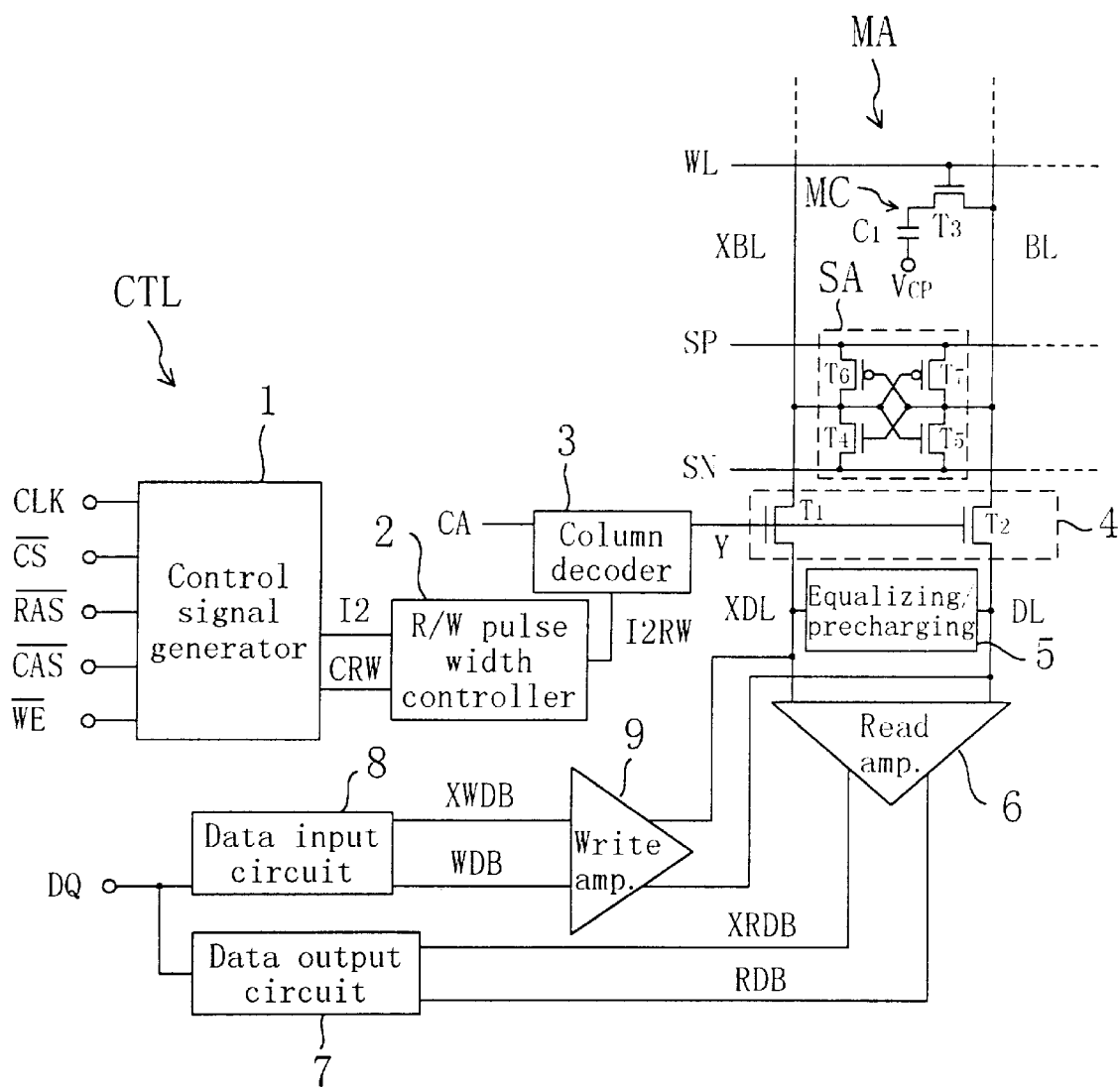
FIG. 1 is a block diagram illustrating a configuration of a semiconductor memory device according to an exemplary embodiment of the present invention.

FIG. 1 illustrates a semiconductor memory device according to a preferred embodiment of the present invention. As shown in FIG. 1, the semiconductor memory device includes an array MA of memory cells MC arranged in columns and rows. Each of these memory cells MC includes a capacitor C1 and a transistor T3. Each of the columns is associated with a sense amplifier SA and a pair of bit lines BL and XBL. The sense amplifier SA is implemented as a latch including n-channel transistors T4 and T5 and p-channel transistors T6 and T7. And each of the rows is associated with a word line WL. In FIG. 1, only a single representative memory cell MC and a single sense amplifier SA, a single pair of bit lines BL and XBL and a single word line WL, which are all associated with the memory cell MC, are illustrated for the sake of simplicity. However, a real-world semiconductor memory device includes; the same number of sense amplifiers SA and bit line pairs BL and XBL as that of the columns in an array MA and the same number of word lines WL as that of the rows in the array MA as is well known in the art.

The semiconductor memory device further includes: a control signal generator 1; a read/write (R/W) pulse width controller 2; a column decoder 3; and a column-select gate 4. The control signal generator 1 generates internal control signals for controlling internal circuits within the device in response to an external clock signal CLK and respective control signals /CS, /RAS, /CAS and /WE that are all supplied from the outside of the device. The R/W pulse width controller 2 generates a read/write (R/W) pulse width control signal I2RW responsive to an internal clock signal I2 and a R/W switching signal CRW, which are two of the internal control signals generated by the control signal generator 1. The column decoder 3 generates a column-select signal Y in response to the R/W pulse width control signal I2RW and a column address pre-decoded signal CA that has been generated based on a column address (not shown) externally given. And the column select gate 4 includes transistors T1 and T2 and controls electrical connection/disconnection between the pair of bit lines BL and XBL and a pair of data lines DL and XDL responsive to the column-select signal Y. In actuality, the same number of column-select gates 4 as that of the pairs of bit lines BL and XBL are provided for a semiconductor memory device.

The R/W pulse width control signal I2RW is equivalent to a column-select-gate-activating signal in a conventional semiconductor memory device, and is used for controlling the pulse width of the column-select signal Y for reading and writing. While the R/W pulse width control signal I2RW is logically high, the column-select signal Y is also asserted as logically high. And while the column-select signal Y is high, the column-select gate 4 connects the pair of bit lines BL and XBL to the pair of data lines DL and XDL.

The semiconductor memory device further includes: an equalizing/precharging circuit 5; a read amplifier 6; a data output circuit 7; a data input circuit 8; and a write amplifier 9. The equalizing/precharging circuit 5 functions as equalizing means for equalizing the potentials on the pair of data lines DL and XDL by charging these lines beforehand. The read amplifier 6 amplifies the potentials on the pair of data lines DL and XDL and transmits the data, which has been transferred through the pair of data lines DL and XDL, to a pair of read data buses RDB and XRDB. The data output circuit 7 outputs the data on the pair of read data buses RDB and XRDB to external circuits through a terminal DQ. The data input circuit 8 transmits the data, which has been received at the terminal DQ, to a pair of write data buses WDB and XWDB. And the write amplifier 9 drives the pair of data lines DL and XDL responsive to the data on the write data buses WDB and XWDB.

The control signal generator 1, R/W pulse width controller 2, column decoder 3 and column-select gate 4 constitute control means CTL.

Figure 2:
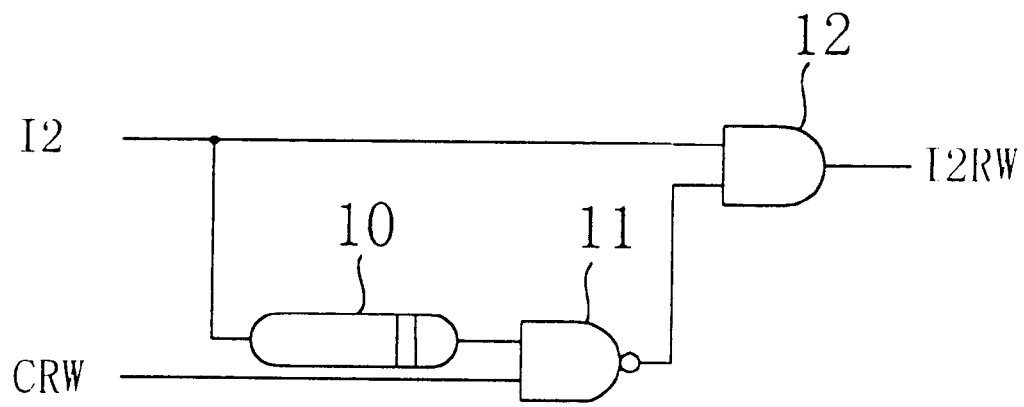
FIG. 2 is a circuit diagram of a read/write pulse width controller of the semiconductor memory device shown in FIG. 1.

FIG. 2 schematically illustrates an internal configuration of the R/W pulse width controller 2. As shown in FIG. 2, the controller 2 includes: a delay device 10; a NAND gate 11; and an AND gate 12. The delay device 10 is used as delay means for delaying the internal clock signal I2. The NAND gate 11 receives the output of the delay device 10 and the R/W switching signal CRW. And the AND gate 12 receives the internal clock signal I2 and the output of the NAND gate 11 and outputs the R/W pulse width control signal I2RW.

Figure 3:
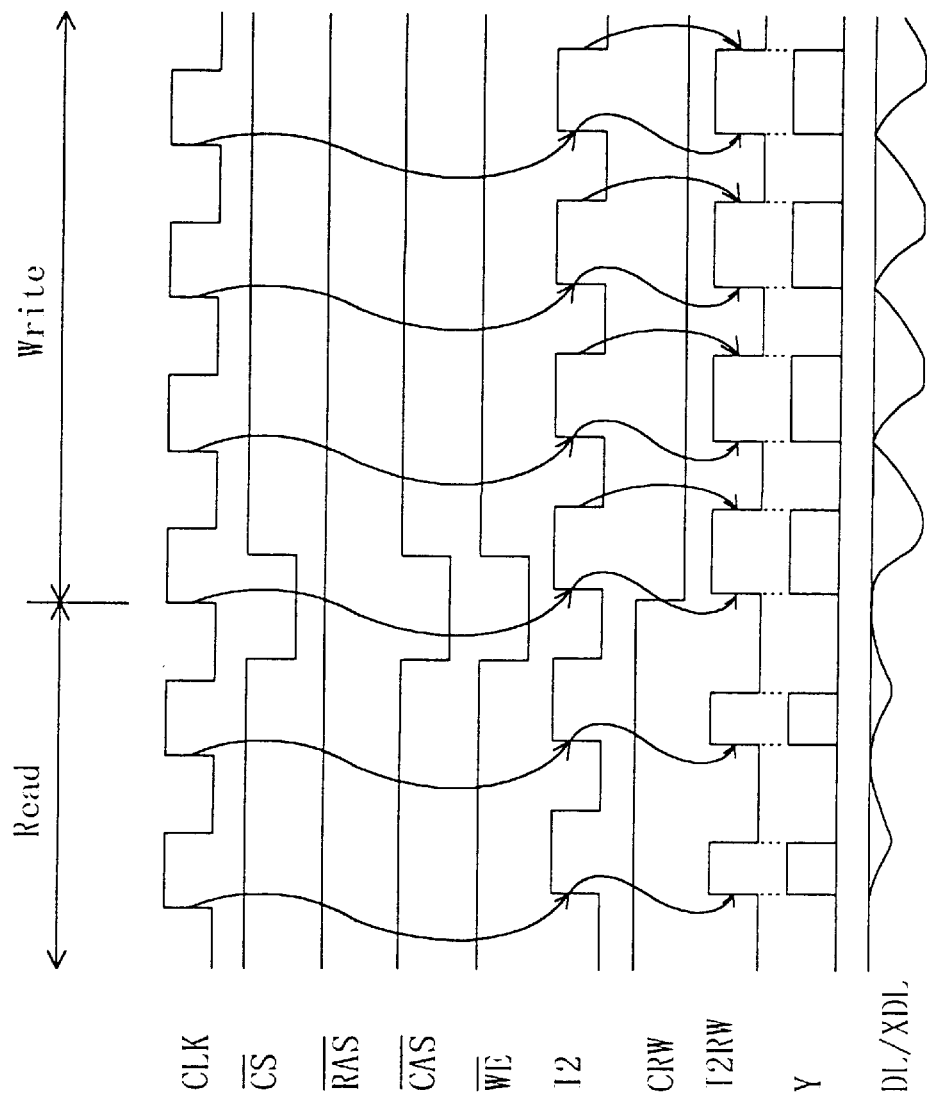
FIG. 3 is a timing diagram illustrating an exemplary operation of the semiconductor memory device shown in FIGS. 1 and 2.
Figure 4:
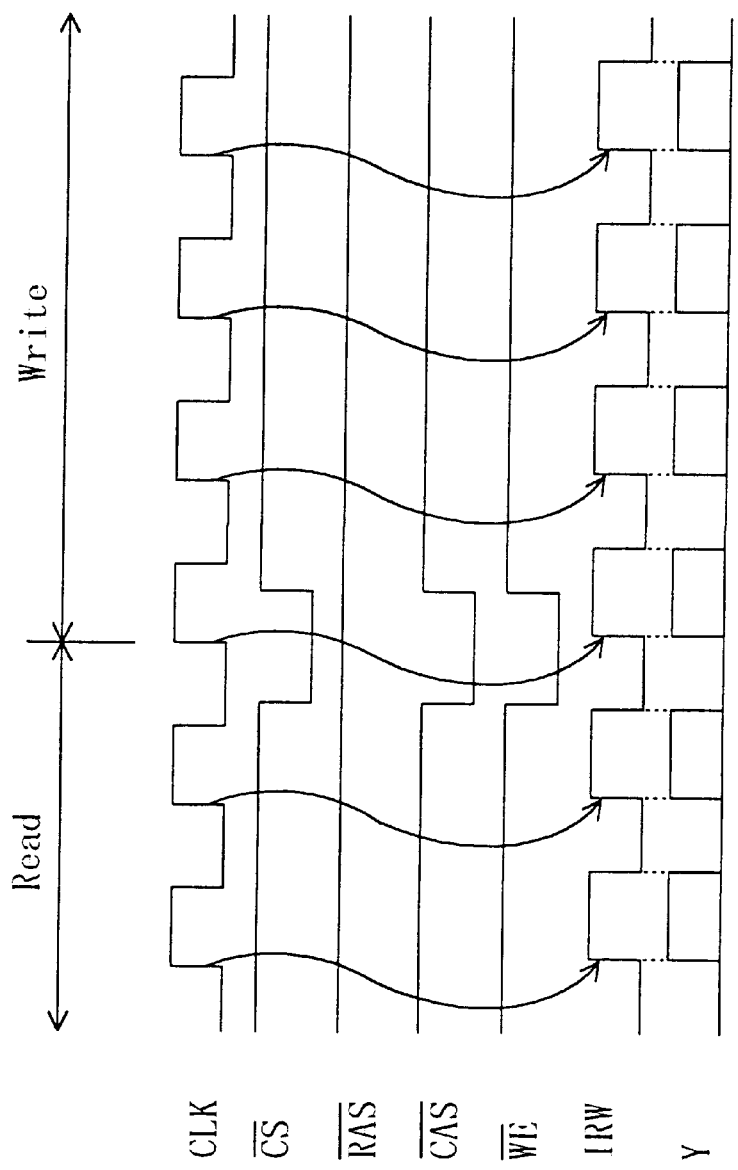
FIG. 4 is a timing diagram illustrating the operation of a conventional semiconductor memory device.

The operation of the semiconductor memory device shown in FIGS. 1 and 2 will be described with reference to FIG. 3. FIG. 3 is a timing diagram illustrating an exemplary operation of the semiconductor memory device shown in FIGS. 1 and 2. In the example illustrated in FIG. 3, reading is performed first, and in response to the input of a write command in synchronism with the third leading edge of the external clock signal CLK, the mode of operation is switched from reading into writing. The write command is input after the control signals /CS, /CAS and /WE have been asserted as logically low and while the control signal /RAS is negated as logically high.

As shown in FIG. 3, each pulse of the internal clock signal I2 is generated in synchronism with an associated leading edge of the external clock signal CLK. In response to the input of the write command, the semiconductor memory device, which has been performing reading until then, starts to perform writing, and the control signal generator 1 negates the R/W switching signal CRW from logically high into low.

While the R/W switching signal CRW is logically high, i.e., during reading, the R/W pulse width controller 2 shown in FIG. 2 functions as a one-shot pulse generator. In such a state, the R/W pulse width controller 2 generates a one-shot pulse as the R/W pulse width control signal I2RW. Each one-shot pulse rises in synchronism with an associated leading edge of the internal clock signal I2 and has a pulse width determined by the delay time caused by the delay device 10. That is to say, as shown in FIG. 3, the pulse width of the R/W pulse width control signal I2RW is shorter than that of the internal clock signal I2 during reading.

On the other hand, while the R/W switching signal CRW is logically low, i.e., during writing, the output of the NAND gate 11 of the R/W pulse width controller 2 shown in FIG. 2 is always logically high. Since one of the inputs to the AND gate 12 is always high, the R/W pulse width control signal I2RW has substantially the same waveform as that of the internal clock signal I2, which is the other input to the AND gate 12. That is to say, as shown in FIG. 3, the pulse width of the R/W pulse width control signal I2RW is substantially equal to that of the internal clock signal I2 during writing.

The R/W pulse width control signal I2RW, generated this way, is supplied to the column decoder 3, which in turn asserts the column-select signal Y as logically high while the R/W pulse width control signal I2RW is high. And the column-select gate 4 connects an associated pair of bit lines BL and XBL to the pair of data lines DL and XDL while the column-select signal Y is logically high. In other words, the amount of time for connecting the associated pair of bit lines BL and XBL and to the pair of data lines DL and XDL is determined by the pulse width of the R/W pulse width control signal I2RW.

It should be noted that equalization and precharging for the pair of data lines DL and XDL are performed while no column-select signal Y is asserted and no pair of bit lines BL and XBL are connected to the pair of data lines DL and XDL. This is equally true irrespective of whether the mode of operation is reading or writing.

During reading, the potentials on the pair of bit lines BL and XBL, which have been amplified by the sense amplifier SA, are transmitted to the pair of data lines DL and XDL while the bit lines BL and XBL are connected to the data lines DL and XDL. The potentials on the data lines DL and XDL are amplified by the read amplifier 6, transmitted onto the read data buses RDB and XRDB, passed through the data output circuit 7, and then output as read data to the outside through the terminal DQ. In this case, since the pulse width of the R/W pulse width control signal I2RW is shorter than that of the internal clock signal I2, the time for connecting the pair of bit lines BL and XBL to the pair of data lines DL and XDL is relatively short. Accordingly, even if the frequency of the external clock signal CLK is increased, plenty of time can be allotted for equalizing the potentials on the pair of data lines DL and XDL. Thus, the potentials on the pair of data lines DL and XDL can be satisfactorily equalized with each other before reading data. As a result, data can be read out at a sufficiently high speed.

On the other hand, during writing, the data to be written, which has been received at the terminal DQ, is supplied to the data input circuit 8 and then transmitted through the write data buses WDB and XWDB. The difference in potential between the write data buses WDB and XWDB is amplified by the write amplifier 9. While the pair of bit lines BL and XBL are connected to the pair of data lines DL and XDL, the data lines DL and XDL are driven and the bit lines BL and XBL are also driven via the column-select gate 4. The difference in potential between the bit lines BL and XBL is transmitted to the capacitor Cl through the transistor T3. As a result, the data is written into the memory cell MC. In this case, the pulse width of the R/W pulse width control signal I2RW is substantially equal to that of the internal clock signal I2. Thus, the time for connecting the pair of bit lines BL and XBL to the pair of data lines DL and XDL is relatively long. Accordingly, even if the frequency of the external clock signal CLK is increased, the bit lines BL and XBL can be connected to the data lines DL and XDL within a sufficiently long time while the potentials on the data lines DL and XDL are greatly swinging. As a result, data can be written stably enough.

As can be understood, the semiconductor memory device according to this embodiment can allot plenty of time for equalizing the potentials on the pair of data lines DL and XDL during reading. Accordingly, data can be read out at a much higher speed. In addition, since this device can connect the pair of bit lines BL and XBL to the pair of data lines DL and XDL within an abundant time during writing, data can be written more accurately.

As is apparent from the foregoing description, the semiconductor memory device of the present invention can independently control the time for connecting a pair of bit lines to the pair of data lines during reading and writing. Accordingly, a time for equalizing potentials on the data lines during reading and a time for connecting a pair of bit lines to the pair of data lines during writing both can be defined long enough. As a result, reading and writing can be performed stably enough at a sufficiently high speed.

What is claimed is:

1. A semiconductor memory device comprising:

an array of memory cells arranged in columns and rows;

plural pairs of bit lines, each said pair of bit lines being provided for associated one of the columns in the array;

a pair of data lines, through which data to be written into, or read out from, the array are transferred;

a control signal generator for generating an internal clock signal and a read/write switching signal in response to an external clock signal and a control input;

a read/write pulse width controller for generating a read/write pulse width control signal in response to the internal clock signal and the read/write swtiching signal, the read/write pulse width control signal having a pulse width variable with whether the mode of operation is reading or writing;

a column decoder for selecting one of the columns in the array in response to a column address, and asserting a column-select signal associated with the selected column while the read/write pulse width control signal is activated;

a plurality of column-select gates, each said column-select gate being provided for associated one of the plural pairs of bit lines and connecting the associated pair of bit lines to the pair of data lines while the associated column-select signal is asserted;

equalizing means for equalizing potentials on the pair of data lines while none of the pairs of bit lines are connected to the pair of data lines; and a write amplifier for driving the pair of data lines in response to data supplied during writing, wherein the read/write pulse width controller comprises delay means, and produces a one-shot pulse, having an active pulse width determined by a delay time caused by the delay means, as the read/write pulse width control signal during reading.

2. The device of claim 1, wherein the read/write pulse with control signal has substantially the same pulse as the internal clock signal during writing.

* * * * *